United States Patent [19]

Ueno

[11] Patent Number: 4,980,856
[45] Date of Patent: Dec. 25, 1990

[54] IC MEMORY CARTRIDGE AND A METHOD FOR PROVIDING EXTERNAL IC MEMORY CARTRIDGES TO AN ELECTRONIC DEVICE EXTENDING END-TO-END

[75] Inventor: Hideo Ueno, Nagoya, Japan

[73] Assignee: Brother Kogyo Kabushiki Kaisha, Aichi, Japan

[21] Appl. No.: 108,498

[22] Filed: Oct. 14, 1987

[30] Foreign Application Priority Data

Oct. 20, 1986 [JP] Japan .................................. 61-249311
Oct. 20, 1986 [JP] Japan .................................. 61-249312
Oct. 20, 1986 [JP] Japan .................................. 61-249313

[51] Int. Cl.$^5$ .......................... G06F 12/02; G11C 5/02
[52] U.S. Cl. .................................... 364/900; 361/393; 361/412
[58] Field of Search ... 364/200 MS File, 900 MS File; 174/117 PC; 361/415, 393, 413, 412

[56] References Cited

U.S. PATENT DOCUMENTS

| 3,772,776 | 11/1973 | Weisenburger | 174/117 PC |
|---|---|---|---|
| 3,794,954 | 2/1974 | Reimer | 361/413 |
| 3,808,505 | 4/1974 | Reimer | 361/413 |
| 3,872,452 | 3/1975 | Stoops | 365/100 |
| 3,898,631 | 8/1975 | Brown et al. | 361/413 |
| 4,025,903 | 5/1977 | Kanfman et al. | 364/200 |
| 4,191,996 | 3/1980 | Chesley | 364/200 |
| 4,237,546 | 12/1980 | Wells | 361/413 |
| 4,296,467 | 10/1981 | Nibby et al. | 364/200 |
| 4,303,993 | 12/1981 | Panepinto | 365/230 |
| 4,361,756 | 11/1982 | Parmentier | 235/487 |
| 4,399,209 | 8/1983 | Sanders et al. | 430/138 |
| 4,404,464 | 9/1983 | Moreno | 235/438 |
| 4,532,419 | 7/1985 | Takeda | 235/492 |
| 4,571,676 | 2/1986 | Mantellina et al. | 364/200 |
| 4,589,063 | 5/1986 | Shah et al. | 364/200 |
| 4,679,167 | 7/1987 | Finnell | 364/900 |

FOREIGN PATENT DOCUMENTS 59-62962 7/1984 Japan.
60-15358 3/1985 Japan.

OTHER PUBLICATIONS

Veronis, "Microprocessors", 1984, pp. 134–137.
Maintenance Information, IBM 3270, Personal Computer, 3rd Edition, Oct. 1984, pp. 4-1800–1802 & 1803.

Primary Examiner—Lawrence E. Anderson
Attorney, Agent, or Firm—Oliff & Berridge

[57] ABSTRACT

A method for providing a plurality of external IC (Integrated Circuit) cartridges to an electronic device having a CPU (Central Processing Unit) is disclosed. The IC cartridge includes first and second connectors. The first is connected to the electronic device and the second is connected to another IC cartridge and enables a plurality of IC cartridges to be connected to one electronic device. Each of the IC cartridges has a selector which selects an individual memory address. Either the IC cartridge or the electronic device has a label on which the method for setting the memory address is indicated.

7 Claims, 6 Drawing Sheets

IC MEMORY CARTRIDGE AND A METHOD FOR PROVIDING EXTERNAL IC MEMORY CARTRIDGES TO AN ELECTRONIC DEVICE EXTENDING END-TO-END

BACKGROUND OF THE INVENTION

1. FIELD OF THE INVENTION

This invention relates to an IC memory cartridge and a method for providing a plurality of external IC memory cartridges to an electronic device, each of the cartridges having selectable memory addresses and being connectable by means of a pair of connectors.

2. PRIOR ART

Recently, an IC card having a 1-chip microcomputer or a memory card incorporating read only memory (ROM) or random access memory (RAM) is popularly used in various fields as handy information media. For example, a bank card, a credit card, an I.D. card, a telephone card, and a clinical chart, all utilize such a memory card.

The memory card has a relatively large data capacity for its size. Moreover, since no exclusive interface is needed, it features a low price. These advantages enable the memory cards to be widely used in electronic devices responsive to various usages and purposes.

The memory card includes a male (or a female) connector. By connecting the male (female) connector to a female (male) connector of an electronic device, data can be read out or written in the memory card. In the case where large amounts of data stored in a magnetic tape or hard disk as an external memory of a mainframe (CPU) are to be stored in the memory card, or in the case where individual, classified data are each stored in separate memory cards, it is necessary to simultaneously connect a plurality of memory cards to an electronic device. In one configuration, plural memory cards are connected to a number of corresponding connectors on the electronic device. This method, however, presents a problem. Since the address setting for the memory is exclusively fixed, a plurality of memory chips are assigned to the same address region.

In order to solve this problem, it is expected that several kinds of memory cards having different address settings are to be used. In this case, however, other problems arise. First, the memory card loses its general use property and flexibility. Second, the user must seek the memory card whose address has been previously set to meet the user desires. Third, the manufacturing cost is increased since the manufacturer must produce a variety of memory cards and the matter of keeping the memory cards becomes more complicated.

SUMMARY OF THE INVENTION

It is an object of the present invention to provide a method for attaching a plurality of connectable external IC memory cartridges to an electronic device.

Another object of the present invention is to provide a method for selectively setting the memory address of the IC memory cartridge to provide general and flexible usage of the cartridge.

A further object of the present invention is to initially indicate an operation for setting the memory address of the IC memory cartridge.

These and other objects are achieved by the present invention having the following construction. Namely, a method for providing a plurality of external IC memory cartridges to an electronic device with a CPU including the steps of:

providing selection means on the IC memory cartridge for assigning by the memory of the IC memory cartridge to a definite region within the memory space of the CPU of the electronic device;

connecting one or more of the IC memory cartridges to the electronic device; and setting the selection means on each of the IC memory cartridges so that the memories of the connected IC memory cartridges do not overlap. The CPU of the electronic device should have an accessible memory space greater than a memory capacity of one IC memory cartridge.

BRIEF DESCRIPTION OF THE DRAWINGS

By way of example and to make the description more clear, reference is made to the accompanying drawings in which.

DETAILED DESCRIPTION OF PREFERRED EMBODIMENTS

An explanation of a first embodiment of the present invention follows and the reference numerals refer to elements shown in FIGS. 1 through 4.

Figure 1:
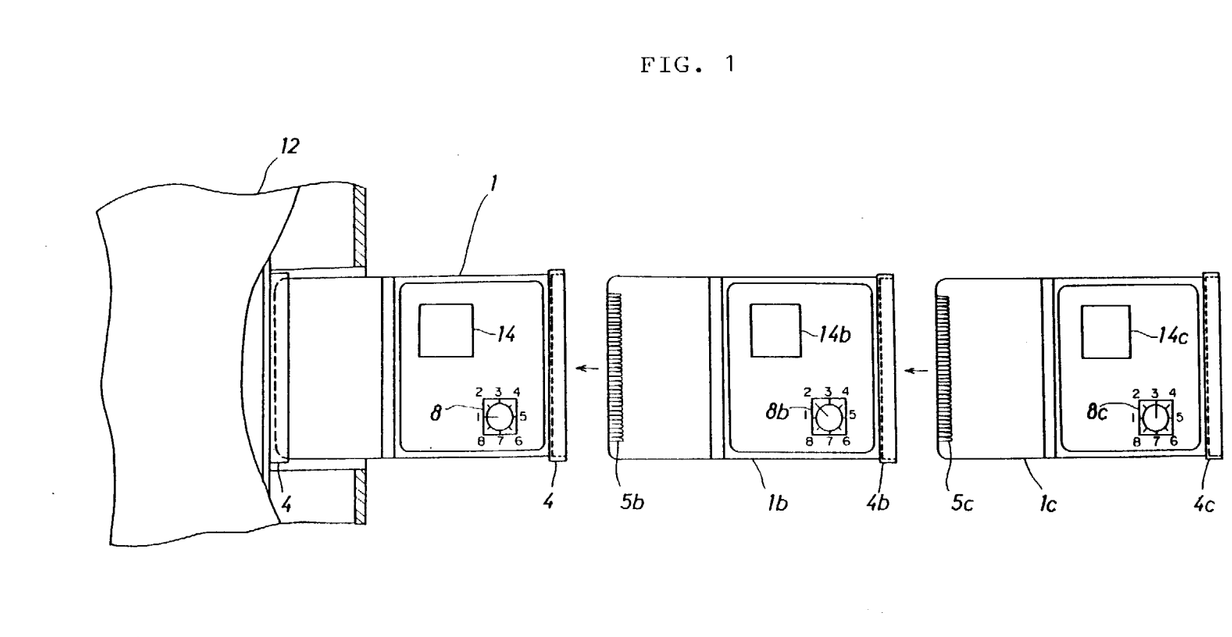
FIG. 1 is a plan view of IC memory cartridges in a first embodiment of the present invention.
Figure 2:
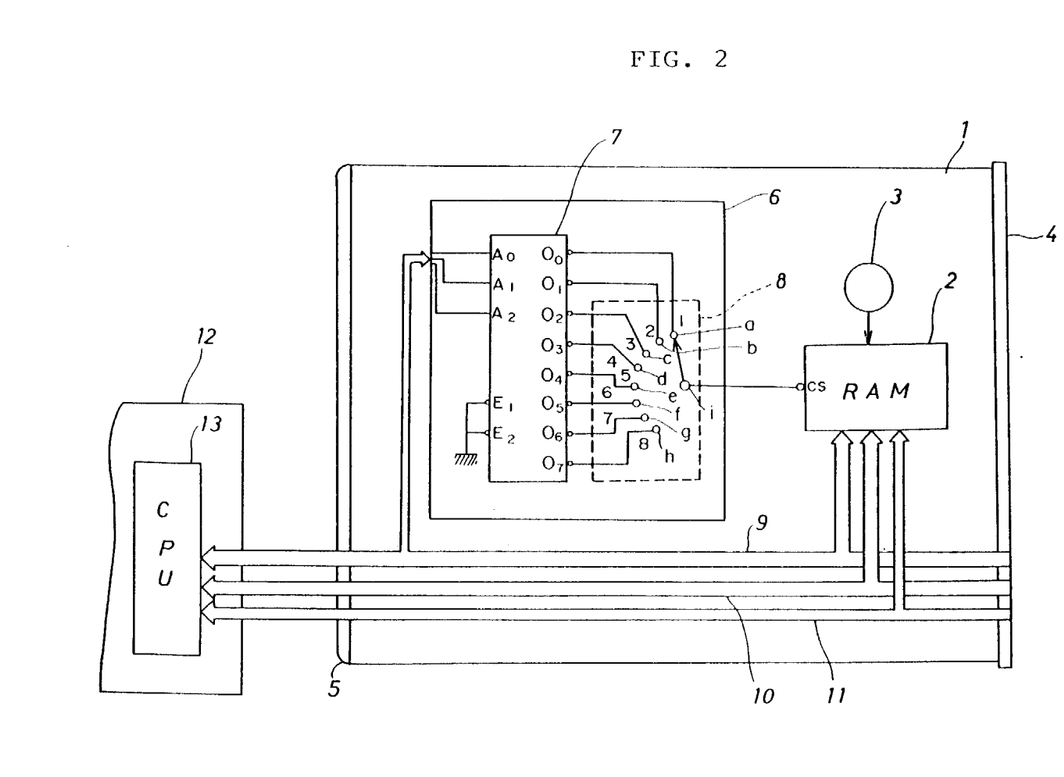
FIG. 2 shows a wiring diagram of an IC memory cartridge thereof.

A memory card 1, which is an embodiment of the IC memory cartridge, is a very thin rectangular card measuring 52 mm × 86 mm. As shown in FIGS. 1 and 2, the memory card includes a 1-chip static RAM 2 (8K bytes); a battery 3 to back up data in the RAM 2; a card edge type female connector 4 and male connector 5 having 30 electrodes at opposite ends of the card 1; an addressor 6; an address bus 9 including 16 lines from AB0 through AB15; a data bus 10 including 8 lines from DB0 through DB7; a control bus 11 including read-/write signal lines; and a plastic casing for covering the memory card 1.

The male connector 5, which is formed at one longitudinal end of the memory card 1, is removably connected to a female connector formed in an electronic device 12 such as a typewriter, a printer or a personal computer. The female connector 4, which is formed at the other longitudinal end of the memory card 1 is also removably connected to a male connector of another memory card 1.

The addressor 6 consists of a decoder chip (IC chip) 7 and a rotary switch 8 for selecting addresses from eight positions ranging from the first position a through the eighth position h. The decoder chip 7 has three input terminals A0, A1 and A2, eight output terminals 00 through 07, and two grounded enable terminals E1 and E2. The input terminals A0, A1 and A2 are connected with corresponding lines AB13, AB14 and AB15 of the address bus 9, respectively. Output lines extending from the terminals 00 through 07 are respectively connected to the address positions a through h of the rotary switch 8. An output line from the common terminal i is connected to a terminal CS (Chip Select) of the RAM 2. The rotary switch 8 is fitted in a rectangular hole formed in the casing. As shown in FIG. 1, eight address positions are equally spaced around the switch 8.

The lines AB0 through AB15 of the address bus 9, the lines DB0 through DB7 of the data bus 10 and the control bus 11 are connected to the connectors 4 and 5 and to the RAM 2. To elaborate, the lines AB0 through AB12 of the address bus 9 are connected to the RAM 2. When the memory card 1 is connected to the electronic device 12, an address bus, a data bus and a control bus of a central processing unit (CPU) 13 of the electronic device 12 are each connected to the corresponding address bus 9, the data bus 10 and the control bus 11 of the memory card 1 via the connectors 4 and 5. Moreover, a Vcc line and a GND (ground) line are also connected to the memory card 1, while they are not shown in the Figure.

Next, the explanation for the selection of the memory address by the addressor 6 is set forth.

Addresses for the 8K byte memory space of the RAM 2 are selected based on the data from the 13 lines AB0 through AB12 of the address bus 9. Then, the data of the lines AB13 through AB15 of the address bus 9 are decoded by the decoder chip 7 according to truth values shown in Table 1. As a result, an L-level signal is output from one of the terminals 00 through 07.

TABLE 1

| Input terminals | | | Output terminals | | | | | | | |
|---|---|---|---|---|---|---|---|---|---|---|
| A0 | A1 | A2 | 00 | 01 | 02 | 03 | 04 | 05 | 06 | 07 |
| L | L | L | L | H | H | H | H | H | H | H |
| H | L | L | H | L | H | H | H | H | H | H |
| L | H | L | H | H | L | H | H | H | H | H |
| H | H | L | H | H | H | L | H | H | H | H |
| L | L | H | H | H | H | H | L | H | H | H |
| H | L | H | H | H | H | H | H | L | H | H |
| L | H | H | H | H | H | H | H | H | L | H |
| H | H | H | H | H | H | H | H | H | H | L |

In accordance with the memory map and the control program of the electronic device 12, a memory region of 64K bytes starting from a certain address is allocated to the memory cards 1. The CPU 13 outputs chip select data on the lines AB13 through AB15 of the address bus 9 as shown in Table 2 for selecting the 8K byte memory region of the RAM 2 in response to the output address data.

TABLE 2

| Address bus | | | |
|---|---|---|---|
| AB13 | AB14 | AB15 | Memory region |
| 0 | 0 | 0 | 0000–1FFF |
| 1 | 0 | 0 | 2000–3FFF |
| 0 | 1 | 0 | 4000–5FFF |
| 1 | 1 | 0 | 6000–7FFF |
| 0 | 0 | 1 | 8000–9FFF |
| 1 | 0 | 1 | A000–BFFF |
| 0 | 1 | 1 | C000–DFFF |
| 1 | 1 | 1 | E000–FFFF |

When the switch 8 is set at the first position a shown in FIG. 2, the addresses '0000–1FFF' (8K bytes) are selected for the RAM 2. In the same manner, other positions from the second position b to the eighth position h respectively correspond to the addresses shown in Table 2. Namely, the addresses '2000–3FFF' are selected by the second position b, the addresses '4000–5FFF' by the third position c, the addresses '6000–7FFF' by the fourth position d, the addresses '8000–9FFF' by the fifth position e, the addresses 'A000–BFFF' by the sixth position f, the addresses 'C000–DFFF' by the seventh position g, and the addresses 'E000–FFFF' by the eighth position h. Thus, the starting address of the RAM 2 can be selected by changing the setting of the switch 8.

Figure 3:
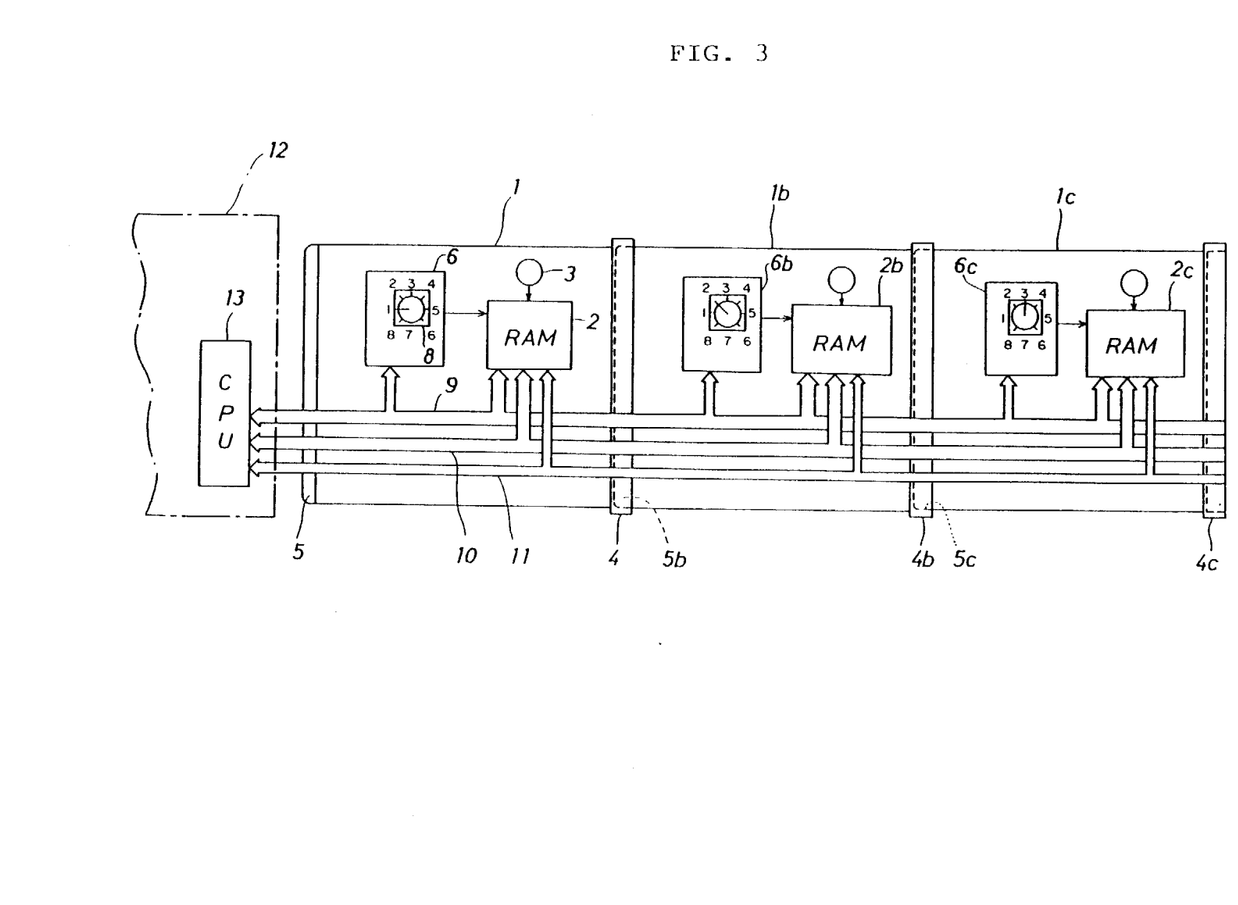
FIG. 3 is a wiring diagram of IC memory cartridges connected in series by connectors.

Hereafter, a method for setting each address of three memory cards 1, 1b and 1c connected in series is described with reference to FIG. 3.

The address bus 9, the data bus 10 and the control bus 11 of the memory cards 1, 1b and 1c are respectively connected to the address bus, the data bus and the control bus of the CPU 13 via the male and female connectors 4, 5, 4b, 5b, 4c and 5c. Individual lines AB0 through AB12 of the address bus 9 are connected to the corresponding RAM 2, 2b, 2c and lines AB13 through AB15 are each connected to the corresponding addressors 6, 6b, and 6c. Each lines DB0 through DB7 of the data bus 10 and the control bus 11 are also connected to the RAM 2. Moreover, the Vcc line and the GND line (not shown) of the electronic device 12 are connected to the memory card 1.

Figure 4:
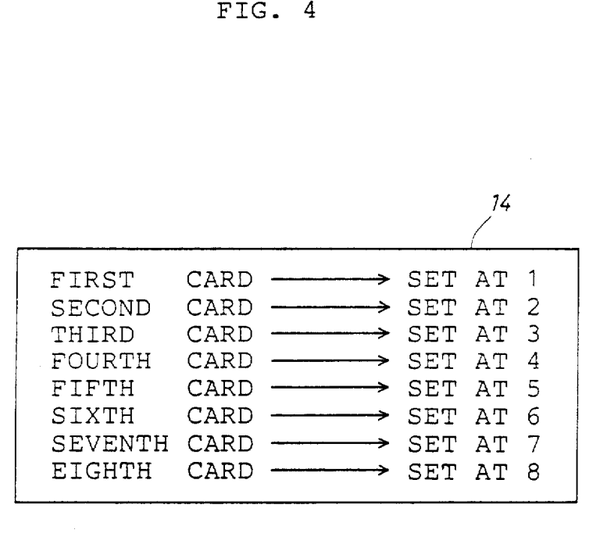
FIG. 4 shows a label indicating a method for setting the memory addresses of the IC cartridges.

A label 14 as shown in FIG. 4 is affixed on the front surfaces of memory cards 1, 1b and 1c. The label shows the card's turn in the sequence when it will be connected to the electronic device 12 and its corresponding address set by the switch 8. In this embodiment, the switch 8 of the memory card 1 which is first connected to the CPU 13 is set at the first position a, and that of the second card 1b is set at the second position b, and that of the third card 1c is set at the third position c, in accordance with the information on the label 14.

Within the 64K bytes (0000-FFFF) of the memory region for the memory cards 1, the first 8K bytes (0000–1FFF) are allotted to the first-connected memory card 1, the next 8K bytes (2000–3FFF) are allotted to the second memory card 1b, the following 8K bytes (4000–5FFF) are allotted to the third memory card 1c. Namely, the total memory region for three connected memory cards accounts for 24K bytes among the 64K bytes in the memory map of the electronic device 12.

The label 14 can be affixed on the surface of the electronic device or on the instruction manual. In relation to this, a second embodiment is described with reference to FIGS. 5A, 5B and 5C. Set forth is an explanation for adding the memory cards 1 to three independent electronic devices 12A, 12B and 12C.

Figure 5A:
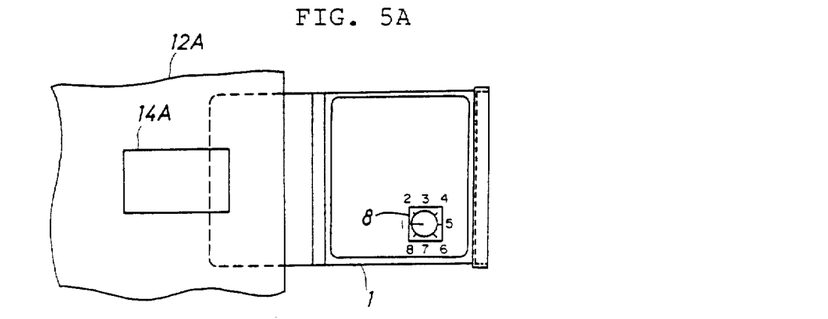
FIGS. 5A, 5B and 5C illustrate a second embodiment of the present invention.
Figure 5B:
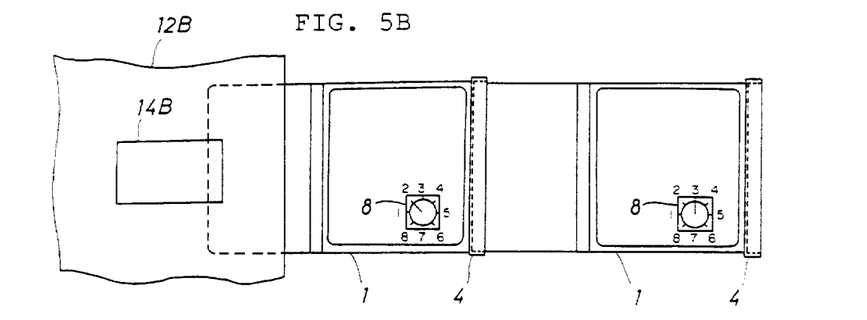
Figure 5C:
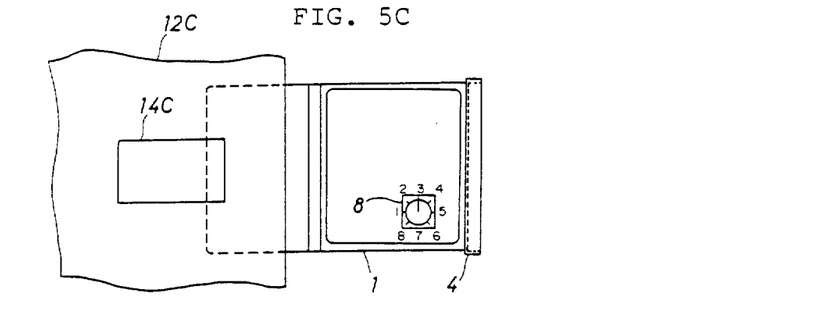

As shown in FIGS. 5A, 5B and 5C, labels 14A, 14B and 14C are applied near the insertion parts of the electronic devices 12A, 12B and 12C, respectively. These labels show information such as the number of memory cards to be connected and the method for setting the address by the addressor 6 of the memory card, based on the memory allotment among the electronic devices 12A, 12B and 12C.

The label 14A of the electronic device 12A indicates "1 memory card. Address set at '1'". The label 14B of the device 12B indicates "1 memory card. Address set at '2'. If additional memory function is optionally provided, the second memory card address is set at '3'". The label 14C of the device 12C indicates "1 memory card. Address set at '3'". When the memory cards 1 are connected to the electronic devices 12A, 12B and 12C, the value of the rotary switch 8 of each memory card is set as indicated by the labels 14A, 14B and 14C.

Since the value of the rotary switch 8 is individually indicated for each of the electronic devices 12A, 12B and 12C, the address can be accurately and quickly set without any difficulty. As a result, the preparation time required for adding the memory cards to the electronic device is reduced and work efficiency is improved. It is possible to attach the labels 14A, 14B and 14C on the instruction manual.

It is optionally possible to use a dip switch, a slide switch or a jumper switch, instead of the rotary switch 8. Otherwise, it is possible to selectively connect desired output terminals by soldering. Conversely, it is possible to cut unnecessary output terminals excepting desired ones.

Figure 6:
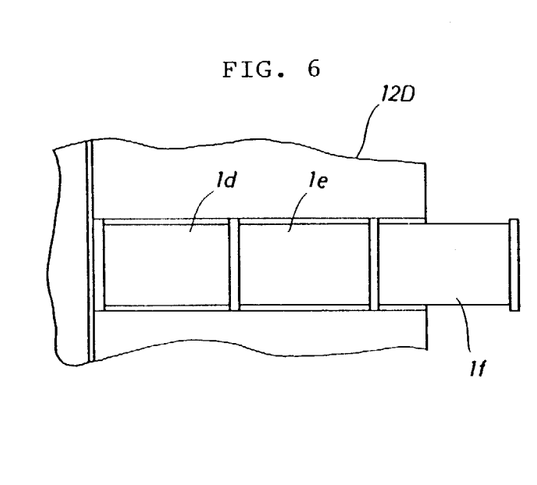
FIG. 6 is a plan view of connected IC cartridges in a third embodiment.

FIG. 6 shows a third embodiment of the present invention. The electronic device 12D has slits into which a plurality of memory cards 1d, 1e and 1f can be inserted. First, a pair of adjoining male and female connectors of the memory cards 1d, 1e and 1f are connected by means of screws or the like. Then, the interconnected memory card is inserted into the slit.

Figure 7:
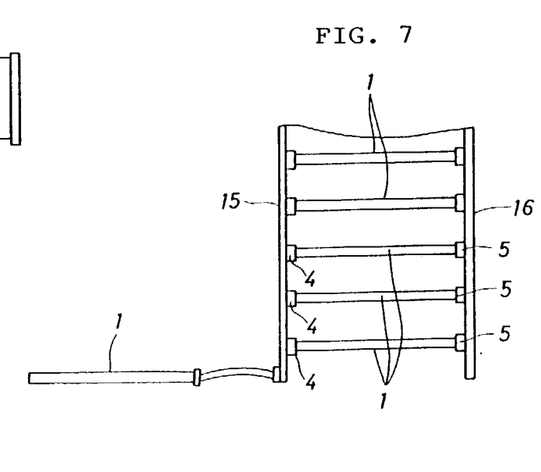
FIG. 7 is a side view showing a fourth embodiment of the present invention.

Furthermore, as shown in FIG. 7, it is possible to connect the memory card 1 provided in the electronic device and a plurality of memory cards held between mother boards 15 and 16, by means of a ribbon cable or the like as a fourth embodiment. An address bus, a data bus and a control bus are printed on each of the mother boards 15 and 16. The mother board 15 is equipped with a number of female connectors 4 at preset intervals, and the mother board 16 is provided with the corresponding number of male connectors 5 at the same preset intervals to face the female connectors 4. Then a number of memory cards 1 are provided between the pair of male/female connectors 4 and 5. By connecting these memory cards 1 provided between the mother boards 15 and 16 and the memory card 1 attached to the electronic device 12 by means of the ribbon cable or the like, a computer having a huge amount of memory space can be realized.

Although the above-mentioned preferred embodiments are described under the condition that a memory card including RAM is connected to the electronic device 12, it is of course possible to apply the present invention when a memory card including ROM, an IC card or a flat rectangular IC cartridge is added to the electronic device 12.

Moreover, numerous modifications and variations of the present invention are possible in light of the above teachings. For example, the female connector 4 can be formed at any edge of the memory card 1 so far as plural cards are sequentially connected. It is therefore to be understood that within the scope of the claims, the invention may be practiced otherwise than as specifically described herein.

What is claimed is:

1. A method for providing a plurality of external IC memory cartridges each having a memory space to a single connector of an electronic device which includes a CPU having an accessible memory space greater than the memory space of the IC memory cartridges, comprising steps as follows:
    providing first and second connectors on each IC memory cartridge, where the IC memory cartridge is rectangular in shape and said first and second connectors are provided at opposite ends of the IC memory cartridge, and said first and second connectors are designed such that one of the connectors may be inserted into the other to permit a plurality of cartridges to be extended end-to-end in substantially the same plane;
    provided selection means on each IC memory cartridge for selectively assigning the memory space of the IC memory cartridge to a definite region within the memory space of the CPU of the electronic device;
    connecting the first connector of a first IC memory cartridge to the connector of the electronic device;
    connecting the first connector of a second IC memory cartridge to the second connector of the first IC memory cartridge; and
    setting the selection means on each of the IC memory cartridges so that the memory spaces of the connected IC memory cartridges do not overlap.

2. An IC memory cartridge for an electronic device which includes a CPU having an accessible memory space greater than the memory space of the IC memory cartridge, and for connection to a plurality of IC memory cartridges, comprising:
    a first connector for connecting the IC memory cartridge to the electronic device;
    selection means for assigning the memory space of the IC memory cartridge to a definite region within the memory space of the CPU of the electronic device; and
    a second connector designed to connect to the first connector of another of said plurality of IC memory cartridges; wherein
    the IC memory cartridge is rectangular in shape and said first and second connectors are provided at opposite ends of the IC memory cartridge, and said first and second connectors are designed such that one of the connectors is inserted into the other to permit a plurality of cartridges to be extended end-to-end in substantially the same plane.

3. An IC memory cartridge for an electronic device, the electronic device including a connector and a CPU having an accessible memory space greater than a memory space of the IC memory cartridge, comprising:
    a first connector for connecting the IC memory cartridge to the connector of the electronic device or with a second connector of another of a plurality of IC memory cartridges;
    selection means for assigning the memory space of the IC memory cartridge to a definite region within the memory space of the CPU of the electronic device; and
    a second connector designed to mate with a first connector of another of said plurality of IC memory cartridges; wherein
    the IC memory cartridge is rectangular in shape and said first and second connectors are provided at opposite ends of the IC memory cartridge, and said first and second connectors are designed such that one of the connectors is inserted into the other to permit a plurality of cartridges to be extended end-to-end in substantially the same plane.

4. The IC memory cartridge as claimed in claim 2, wherein the IC memory cartridge further comprises a label on which a note is printed, the note showing how the selection means of each of the IC memory cartridges that are connected to the electronic device is set.

5. The IC memory cartridge as claimed in claim 2, wherein the selection means includes a rotary switch for selecting the assignment of the memory space.

6. A method for providing a plurality of external IC memory cartridges to an electronic device, the electronic device including a connector a CPU having an accessible memory space greater than a memory space of one of the IC memory cartridges, the method comprising the steps as follows:

provide two connectors to each of the IC memory cartridges, where the IC memory cartridge is rectangular in shape and said first and second connectors are provided at opposite ends of the IC memory cartridge, and said first and second connectors are designed such that one of the connectors may be inserted into the other to permit a plurality of cartridges to be extended end-to-end in substantially the same plane;

providing selection means to each of the cartridges, each selection means provided for selectively assigning the memory space of its IC memory cartridge to a definite region within the memory space of the CPU of the electronic device;

preparing two connecting plates each having a plurality of connectors thereon designed to mate with the connectors of the IC memory cartridges;

connecting one or more of the IC memory cartridges between the two connecting plates;

connecting a unit composed of the connecting plates and said one or more of the IC memory cartridges to one connector of another IC memory cartridge, the other connector of which is connected to the connector of the electronic device; and setting the selection means on each of the memory cartridges so that the memory spaces of the connected IC memory cartridges do not overlap.

7. A method as claimed in claim 1, further comprising the step of connecting the first connector of an additional IC memory cartridge to the second connector of a last connected IC memory cartridge, said step capable of being repeated until a sum of the memory space of the IC memory cartridges is equal to the accessible memory space of the CPU or the IC memory cartridges can no longer be set during the setting step so as not to overlap.

* * * * *